(12) United States Patent
Aspas Puertolas

(10) Patent No.: US 8,581,103 B2
(45) Date of Patent: Nov. 12, 2013

(54) PARTS MADE OF ELECTROSTRUCTURAL COMPOSITE MATERIAL

(75) Inventor: Jesus Aspas Puertolas, Paris (FR)

(73) Assignee: European Aeronautic Defence and Space Company Eads France, Paris (FR)

( * ) Notice: Subject to any disclaimer, the term of this patent is extended or adjusted under 35 U.S.C. 154(b) by 429 days.

(21) Appl. No.: 12/746,338

(22) PCT Filed: Dec. 9, 2008

(86) PCT No.: PCT/EP2008/067090
§ 371 (c)(1),
(2), (4) Date: Sep. 9, 2010

(87) PCT Pub. No.: WO2009/074564
PCT Pub. Date: Jun. 18, 2009

(65) Prior Publication Data
US 2011/0011627 A1   Jan. 20, 2011

(30) Foreign Application Priority Data
Dec. 10, 2007 (FR) .................................. 07 59671

(51) Int. Cl.
*H05K 1/09* (2006.01)
*B32B 3/12* (2006.01)
*E04C 2/52* (2006.01)

(52) U.S. Cl.
USPC ........................ 174/251; 426/116; 52/220.2

(58) Field of Classification Search
USPC ............. 174/117 F, 251, 255, 497, 499, 505; 52/220.2
See application file for complete search history.

(56) References Cited

U.S. PATENT DOCUMENTS

| | | | | |
|---|---|---|---|---|
| 3,263,023 A | * | 7/1966 | Staley | 174/255 |
| 3,346,442 A | * | 10/1967 | Carmody | 428/118 |
| 3,612,744 A | * | 10/1971 | Thomas | 174/36 |
| 3,700,825 A | * | 10/1972 | Taplin et al. | 174/36 |
| 4,689,442 A | * | 8/1987 | Ozaki | 174/266 |

(Continued)

FOREIGN PATENT DOCUMENTS

| | | |
|---|---|---|
| GB | 1 258 702 | 12/1971 |
| WO | WO 01/80374 | 10/2001 |
| WO | WO 2005/123375 | 12/2005 |

OTHER PUBLICATIONS

Shielding for Electronics, Inc. (WO 01/80374 A1) provided with Office Action.*

(Continued)

*Primary Examiner* — Timothy Thompson
*Assistant Examiner* — Roshn Varghese
(74) *Attorney, Agent, or Firm* — RatnerPrestia

(57) ABSTRACT

A ridge structural part made of laminated composite material incorporates electrically conducting cables, the structural part includes at least two structural layers including fibers held in place by a thermosetting or thermoplastic matrix, at least one conducting network layer located between two of the at least two structural layer, the at least one conducting network layer including a network of electrically conducting cables, said electrically conducting cables being arranged throughout said structural part in a substantially regular manner and being electrically insulated from said two structural layers by a dielectric material. The structural part also includes electrical connections, to which electrically conducting cables of the at least one network layer are electrically connected so as to form an electrical network by assembling several structural parts.

9 Claims, 4 Drawing Sheets

(56) References Cited

U.S. PATENT DOCUMENTS

| | | | | |
|---|---|---|---|---|
| 4,972,197 | A * | 11/1990 | McCauley et al. | 343/704 |
| 5,219,292 | A * | 6/1993 | Dickirson et al. | 439/67 |
| 5,344,696 | A * | 9/1994 | Hastings et al. | 428/220 |
| 5,648,137 | A * | 7/1997 | Blackmore | 428/102 |
| 6,421,250 | B1 * | 7/2002 | Kim et al. | 174/254 |
| 6,611,659 | B2 * | 8/2003 | Meisiek | 392/435 |
| 7,047,349 | B2 | 5/2006 | Carpenter | |
| 7,232,315 | B2 * | 6/2007 | Uchida et al. | 439/67 |
| 2004/0031219 | A1 * | 2/2004 | Banister | 52/220.2 |
| 2006/0137280 | A1 * | 6/2006 | Bartnes | 52/582.2 |
| 2006/0138279 | A1 * | 6/2006 | Pisarski | 244/118.5 |
| 2006/0289144 | A1 * | 12/2006 | Akerlind | 165/56 |

OTHER PUBLICATIONS

International Search Report dated Apr. 2, 2009.

* cited by examiner

PARTS MADE OF ELECTROSTRUCTURAL COMPOSITE MATERIAL

This application claims priority of PCT International Application No. PCT/EP2008/067090 filed on Dec. 9, 2008. The contents of which are incorporated herein by reference.

FIELD OF THE INVENTION

This invention concerns an assembled structure of parts made of composite material. More specifically, this invention concerns an assembled structure of parts made of composite material, which is suited to the production of load-bearing aircraft structures and the installation of an electrical network in an aircraft.

BACKGROUND

Composite materials are now widely used in many industrial fields, especially in the aeronautics and aerospace fields, which benefit from the various properties that these materials possess.

These composite materials are used, for instance, to manufacture load-bearing aircraft structures, in which combined properties of lightness and mechanical resistance permit the manufacture of load-bearing structures that are lighter than those manufactured using conventional materials but have an equivalent mechanical resistance, and therefore permit the manufacture of an aircraft that consumes less energy or carries a greater payload.

Manufacturing load-bearing structures requires a structural dimensioning step wherein the stresses to which the various structures will be subject (mechanical, thermal, etc) are identified, and the properties of the composite materials for the parts are determined.

After the load-bearing aircraft structures are produced, the various systems that the aircraft comprises are installed. An aircraft generally comprises several types of systems, for instance the electrical/electronic systems such as the avionics, the power distribution network, or the network transmitting passenger data such as the audio/video signals of the in-flight entertainment system.

The installation of the electrical/electronic systems, which are more and more numerous and more and more complex, requires installing a plurality of bundles of cables that are placed, for example, along load-bearing structures where said bundles of cables are exposed to potential damage.

It is known from patent U.S. Pat. No. 7,047,349 for the entire electrical/electronic network to be integrated directly in a single part made of composite material, between the layers of said composite material, in the case of an airplane essentially comprising an upper part and a lower part.

In patent U.S. Pat. No. 7,047,349, the integration of different electrical/electronic elements (cables, interconnecting stations, etc) between the folds of a composite material has an impact on the homogeneity of said material, resulting in its mechanical resistance being reduced.

Moreover, integrating the entire electrical network in a single part is not suited to producing large-sized airliners, where parts are generally made from a large number of composite material parts that are assembled.

Further, integrating electrical/electronic elements in load-bearing structures poses a problem of electromagnetic compatibility such as, for instance, lightning protection for said elements, which is a particularly important problem for structures made from composite materials.

SUMMARY OF THE INVENTION

This invention concerns rigid load-bearing structural parts made of laminated composite material that integrate a network of electrically conducting cables having a structural role in said part. Preferably, the parts also integrate a metallic layer to provide an electrical reference for the installation of electrical/electronic systems. The metallic layer further provides electromagnetic protection for the network of electrically conducting cables. The parts are assembled to produce a load-bearing structure, and each part comprises means allowing conducting cables to be connected to various parts so as to form an electrical network at the level of the assembled structure.

A rigid load-bearing structural part made of laminated composite material according to this invention incorporates electrically conducting cables. The structural part is characterized in that it comprises:
- at least two structural layers comprising fibers held in place by a matrix made of a thermosetting or thermoplastic resin,
- at least one conducting network layer located between two of the at least two structural layers, comprising a network of electrically conducting cables, the electrically conducting cables being arranged throughout the structural part in a substantially regular manner and being electrically insulated from the two structural layers by a dielectric material,
- electrical connection means for electrically connecting structural parts to each other, to which electrically conducting cables of the at least one network layer are electrically connected.

By arranging the conducting cables regularly throughout the structural part, the mechanical properties of said structural part are substantially uniform throughout the part. The conducting cables are in addition able to transmit electrical signals from one electrical connection means to another.

In a preferred embodiment, the structural part comprises at least three structural layers and at least one conductive reference layer located between two of the at least three structural layers. The at least one conductive reference layer is conductive in all directions and is connected to the electrical connection means. The at least one conductive reference layer has a structural role and is able to conduct an electrical reference.

To produce an especially robust structural part, said part comprises at least four structural layers and at least one layer of an alveolar-type material, located between two structural layers, in order to obtain a part in a sandwich type of material.

The conductive reference layer is preferably a metal sheet, or a grid comprised of metallic or metalized cables, or a layer of a metallic alveolar material.

In a particular embodiment, the electrical connection means are metalized holes that open to an interconnection surface of the structural part.

In another embodiment, the electrical connection means are external connectors surface-mounted on an interconnection surface of said structural part.

The electrical connection means are, in another embodiment, internal connectors located in said structural part and accessible from an interconnection surface or from an edge of said structural part.

Preferably, the dielectric material, electrically insulating the electrically conducting cables from the structural layers, is of the same composition as the thermosetting or thermoplastic resin used to produce the structural layers.

To produce robust structural parts, each structural layer of the part comprises carbon fibers.

The invention also relates to an assembled load-bearing structure that comprises at least two rigid structural parts made of composite material incorporating electrically conducting cables.

The load-bearing structure is characterized in that each structural part comprises:
- at least two structural layers comprising fibers held in place by a matrix made of a thermosetting or thermoplastic resin,
- at least one conducting network layer located between two of the at least two structural layers, comprising a network of electrically conducting cables, the electrically conducting cables being arranged throughout the structural part in a substantially regular manner and being electrically insulated from the two structural layers by a dielectric material,
- electrical connection means, to which electrically conducting cables from the at least one network layer are electrically connected.

The load-bearing structure is also characterized in that the at least two structural parts are electrically connected by the connection means and form an electrical network integrated in the load-bearing structure.

Preferably, each structural part of the load-bearing structure comprises at least three structural layers and at least one conductive reference layer located between two of the at least three structural layers, the at least one conductive reference layer being conductive in all directions and connected to the electrical connection means in order to provide an electrical reference.

Advantageously, the structural parts' connection means are electrically connected by external interconnection means that are, for example, removable.

Such an assembled load-bearing structure is for example used to manufacture a floor made of composite material for a vehicle, especially an aircraft type, said floor integrating an electrical network enabling different equipment to be connected.

BRIEF DESCRIPTION OF THE DRAWINGS

The following description of embodiments of the invention is made with reference to the figures that represent in a non-limiting way.

DETAILED DESCRIPTION

This invention concerns structural parts made of composite material for manufacturing load-bearing structures of vehicles, especially aircraft type, such as, for example, panels for manufacturing floors.

Such structural parts are in a composite material of a type comprising fibers held in place by a matrix made of a thermosetting resin, most usually an epoxy resin, or a thermoplastic resin such as, for example, a resin based on polyether ether ketone (PEEK), polyether ketone ketone (PEKK), polyetherimide (PEI), phenylene polysulphide (PPS), etc.

Such structural parts are rigid parts.

It is understood that said structural parts, especially when they are made of a thermoplastic matrix composite material, can present a certain plasticity when they are brought to a high temperature, for example greater than 100° C. Nevertheless said structural parts are rigid in what are known as normal conditions of use, for example at an aircraft cabin's ambient temperature in the case of aircraft floor panels.

Figure 1:
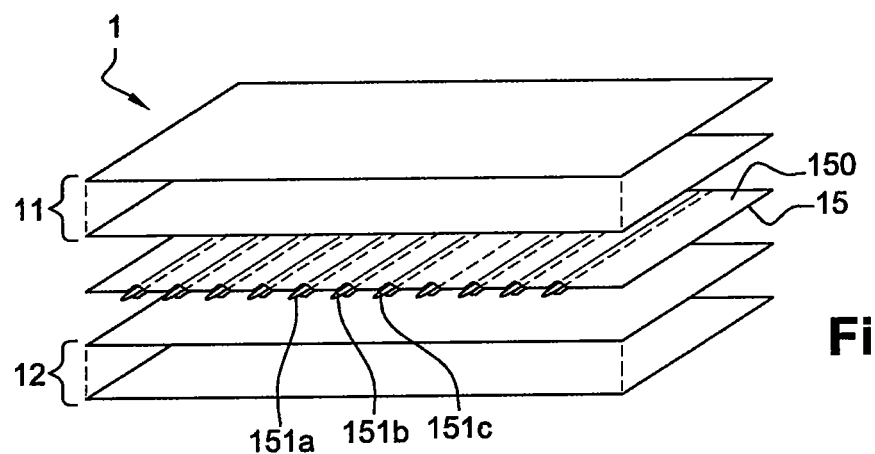
- FIG. 1, an exploded schematic view of a structural part made of laminated composite material according to a first embodiment of the invention,
- FIG. 2, an exploded schematic view of a structural part made of laminated composite material according to a second embodiment of the invention,
- FIG. 3a and FIG. 3b, exploded schematic views of a structural part made of laminated composite material according to a third embodiment of the invention and a variant of this third embodiment,
- FIG. 4a, FIG. 4b, FIG. 4c and FIG. 4d, perspective schematic views of several embodiments of the structural part's electrical connection means,
- FIG. 5, a schematic view of an assembled load-bearing structure comprising a plurality of structural parts.

As shown in FIG. 1, a structural part made of laminated composite material comprises in a conventional way a plurality of layers assembled together.

The structural part 1 made of laminated composite material according to the invention comprises at least a first structural layer 11 and a second structural layer 12. The structural layers 11 and 12 have substantially the same dimensions and have shapes adapted to the shape of said structural part to be produced, for example a simple shape such as a rectangular panel for producing aircraft floors.

The structural layers 11 and 12 are preferably of the same type, for example made of glass, carbon or aramid fibers, said fibers being woven or unidirectional, impregnated with a thermosetting or thermoplastic resin forming a matrix. Said structural layers are, for instance, made from pre-impregnated fibers or dry fibers impregnated with resin during the process of manufacturing said part.

A first electrically conductive layer, referred to as a network layer 15, is located between the structural layers 11 and 12, and has substantially the same shape and the same dimensions as said structural layers.

The network layer 15 is formed of a dielectric material layer 150 providing the structural link with the structural layers 11 and 12. The dielectric material layer 150 is, for example, made from a thermosetting or thermoplastic resin, preferably with the same composition as the resin forming the matrix of the laminated composite material.

The dielectric material layer 150 incorporates a network of conducting cables 151a-151c that are not in contact with each other and are arranged in a substantially regular way throughout the structural part 1. For example, said conducting cables are substantially parallel following a substantially regular course throughout said structural part, or in areas of said structural part such as areas that are not traversed by fixing elements. The conducting cables 151a-151c are, in a particular embodiment, arranged in close pairs.

The conducting cables 151a-151c are preferably metallic cables, for example aluminum, copper, etc.

The conducting cables 151a-151c preferably have the same diameter. In a particular embodiment, said conducting cables have different diameters, for example two diameters d0 and d1, and are arranged regularly in the dielectric material layer 150, for example a regular alternation of conducting cables of diameters d0 and d1.

Each conducting cable 151a-151c comprises two ends and is arranged such that each end of said cable is located in the vicinity of an edge of the network layer 15. The ends of a conducting cable 151a-151c are preferably in the vicinity of different edges, for example opposite edges in the case of a rectangular-shaped network layer 15.

The structural layers 11 and 12 and the network layer 15 are assembled, to form the structural part 1 made of composite material, using a conventional process such as, for example, a resin transfer process or an autoclave process. Particularly in the case of a thermosetting resin, said process comprises a curing step during which said thermosetting resin is hardened.

The network layer 15, because of the conducting cables 151a-151c and the dielectric material layer 150 that provides the structural link with the structural layers 11 and 12, plays a structural role in part 1, and contributes to the said part's mechanical resistance.

Because of the substantially regular arrangement of conducting cables 151a-151c throughout the dielectric material layer 150, the mechanical properties of the structural part 1 are substantially uniform in every part of said structural part.

Because of the conducting cables 151a-151c located inside the dielectric material layer 150, the structural part 1 is able to transmit electrical signals from one end to the other of each conducting cable, such as data or control signals, and/or to conduct electrical currents in the case of a power supply. In the case in which said cables are arranged in pairs, the electrical signals are for example differential signals.

In the rest of the description, only the case of electrical signals is described.

The diameters of conducting cables 151a-151c are, for example, determined according to characteristics of the electrical signals to be transmitted, and a spacing between said cables is preferably such that interference between said cables is minimized.

In a particular embodiment, said conducting cables are arranged in the manner of a printed circuit, for transmitting the electrical signals in different directions, while still being distributed in a substantially uniform way throughout structural part 1. If the mechanical properties of the structural part 1 are locally degraded, said part is, for example, strengthened locally by using inserts and/or stiffeners to ensure substantially uniform mechanical properties everywhere.

Because of the electrically insulating dielectric material layer 150, the conducting cables 151a-151c transmitting electrical signals are electrically insulated from structural layers 11 and 12, which is especially advantageous in the case of electrically conductive structural layers, for instance layers composed of carbon fiber composite (CFC).

In a similar embodiment of the network layer 15, not shown, the conducting cables 151a-151c are woven on a structural layer, and each conducting cable comprises a dielectric material sheath 150 that insulates said cable electrically from the structural layers of structural part 1.

In a particular embodiment, not shown, the laminated composite material structural part 1 comprises at least a second network layer 15'. In the case of network layers 15 and 15' with substantially parallel conducting cables, said network layers preferably have different orientations, for example such that conducting cables of different layers are substantially orthogonal.

Because of the second network layer 15', the mechanical resistance of structural part 1 is increased. The mechanical properties of said structural part are also more uniform because of the different orientation of the two network layers 15 and 15'.

Advantageously, conducting cables of different conductive layers are linked electrically. For example, conducting cable 151a and a conducting cable 151a' of network layer 15' are linked by means of a through connection at the point where said conducting cables, substantially orthogonal, cross. By linking conducting cables from different network layers, one electrical signal is transmitted in different directions.

Figure 2:
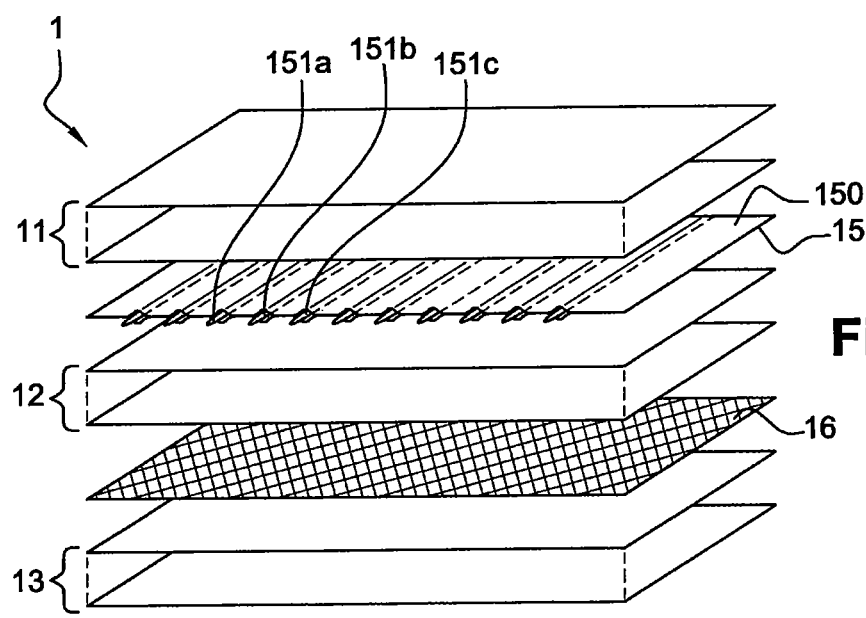

FIG. 2 shows a second embodiment of the invention in which structural part 1 comprises an electrically conductive layer, referred to as reference layer 16, located between structural layer 12 and a structural layer 13.

The structural layer 13 and the reference layer 16 have substantially the same shape and the same dimensions as structural layers 11 and 12.

The reference layer 16 is basically a metallic layer, and is formed for example of a thin metal sheet, or a regular fabric of metallic or metalized fibers, or a regular grid of metallic or metalized cables.

The reference layer 16, because of its regular and metallic nature, also participates in a substantially uniform way in the mechanical properties of structural part 1.

The reference layer 16 is, in addition, also because of its basically metallic nature, conductive in all directions. "Conductive in all directions" is understood to mean that an electrical signal, applied at one point of reference layer 16, is transmitted everywhere in said reference layer. The reference layer 16 is thus able to conduct an electrical reference, for instance a reference common to all the electrical signals transmitted by the network layer 15, such as the ground.

The reference layer 16 also protects the conducting cables 151a-151c of the network layer 15 against electromagnetic interference whose origin is on one side of a surface of said reference layer opposite said network layer. Electromagnetic interference is caused, for instance, by the strong electromagnetic fields emitted by radars, by radiation from on-board electrical/electronic systems or by lightning.

Figure 3A:
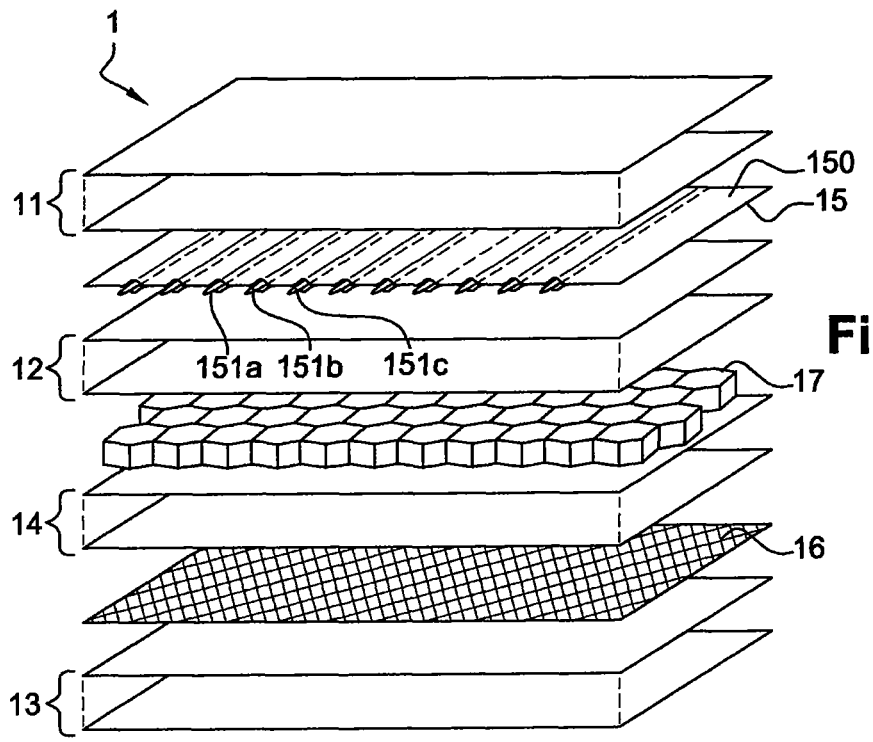

FIG. 3a shows a third embodiment of a structural part 1 according to the invention, of a sandwich type, in which a layer of an alveolar material 17, for example a honeycomb type of material, is sandwiched between layers, preferably structural layers. For example the alveolar layer 17 is located between structural layer 12 and a structural layer 14, and the reference layer 16 is located between structural layers 13 and 14.

Sandwich-type materials are particularly advantageous because of a high mechanical resistance/weight ratio, and the alveolar layer 17 is for instance made of aluminum or Nomex®.

Figure 3B:
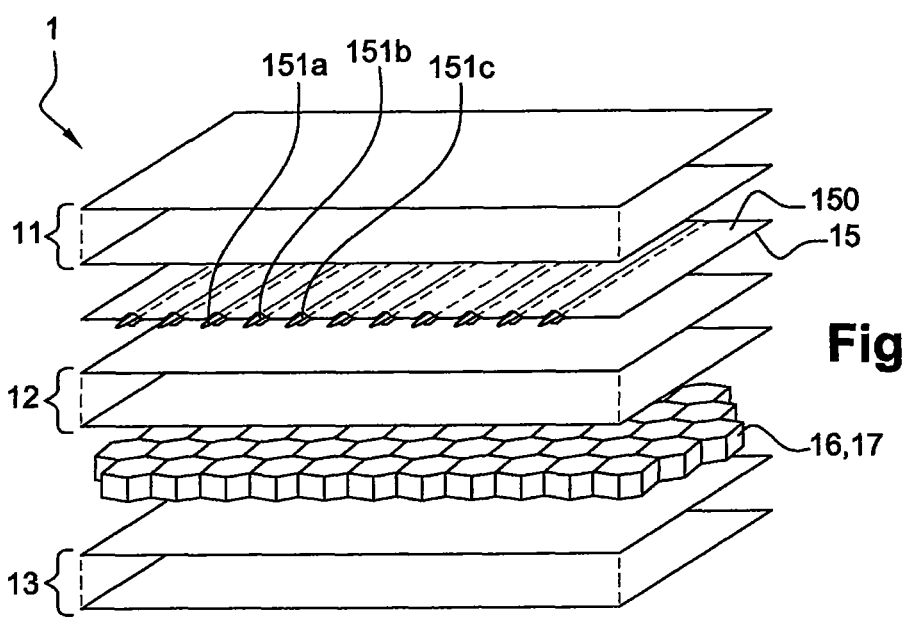

In a similar embodiment of a structural part 1 made of a sandwich type of composite material according to the invention, shown in FIG. 3b, the alveolar layer 17, made in an electrically conductive material, advantageously performs the functions of the reference layer 16.

Structural layers 11-14 are, in a particular embodiment, composed of a plurality of layers, as shown in FIGS. 1, 2, 3a and 3b. The number of layers is basically determined by the mechanical properties and thickness required for structural part 1.

In another embodiment, not shown, the structural part 1 comprises two network layers 15 and 15' and the reference layer 16, separated by structural layers. More generally, the structural layer 1 comprises a plurality of network layers and a plurality of reference layers. The arrangement of said network and reference layers is, for example, such that a reference layer is sandwiched between two network layers so as to reduce electromagnetic interference from one to the other and vice-versa, and/or such that the network layers are all located between two reference layers, so as to improve said network layers' electromagnetic protection against interference generated by external electromagnetic fields or radiation from on-board electrical/electronic systems.

The structural part 1 made of laminated composite material also comprises electrical connection means 18 that are electrically connected to conducting cables of the network layer 15 and to the reference layer 16.

Electrical connection means 18 are connected to the two ends of the conducting cables and to at least two points of the reference layer 146. The examples described below only illustrate the electrical connection means of one side of the structural part 1, linked to one end of each connected conducting cable, and similar electrical connection means are used for the second end of each connected conducting cable and for the second point of said reference layer.

The electrical connection means 18 are either external connectors surface-mounted on the structural part 1 on an interconnection surface, or internal connectors integrated between layers forming said structural part, for connection via the interconnection surface or via the edge of said structural part.

The connection means of different structural parts are connected directly, i.e. they are geometrically designed to provide an electrical connection by the mechanical assembly of parts, or indirectly via interconnection means 5, which link connection means of different structural parts, such as a coaxial cable, a computer ribbon cable or any type of electrical cable able to carry one or more electrical signals.

Figure 4A:
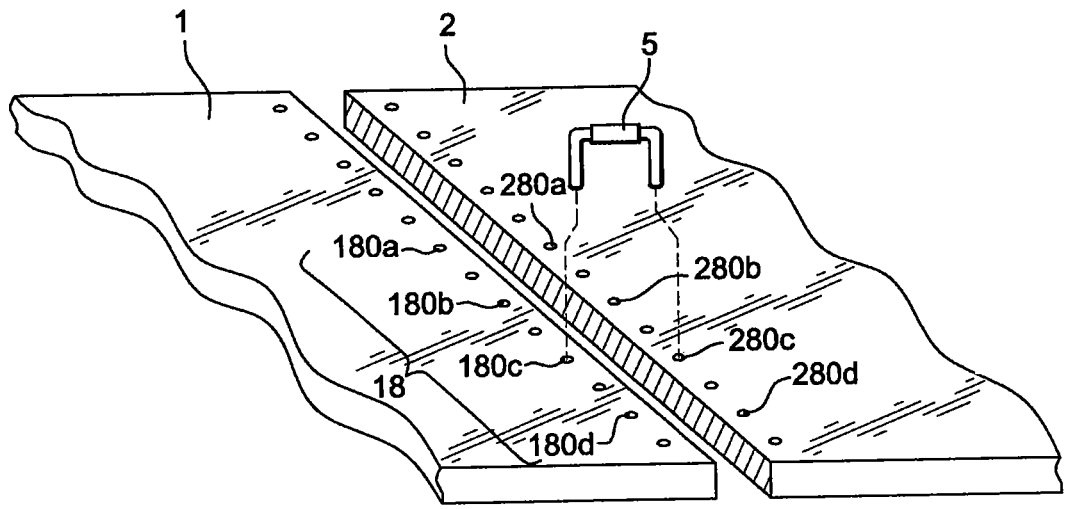

FIG. 4a shows a first embodiment of electrical connection means 18, in which said connection means are internal connectors, in this case metalized holes 180a-180d. Holes 180a-180d open onto the interconnection surface in the vicinity of an edge of the structural part 1, and each hole 180a-180d electrically links an electrical cable 151a-151c respectively of the network layer 15 or reference layer 16 to the interconnection surface.

Holes 180a-180d are for instance, but not necessarily, aligned with respect to the edge of structural part 1. In the case in which holes 180a-180d pass through structural part 1, reference layer 16 advantageously comprises notches at the holes corresponding to conducting cables, such that there is no electrical link between conducting cables 151a-151c and reference layer 16.

By means of these holes 180a-180d and holes 280a-280d made in a structural part 2, conducting cables 151a-151c are connected indirectly to cables 251a-251c of the structural part 2, and the reference layer 16 is connected indirectly to a reference layer 26 of said structural part 2, by interconnection means 5, such as U-clips, as shown in FIG. 4a.

Figure 4B:
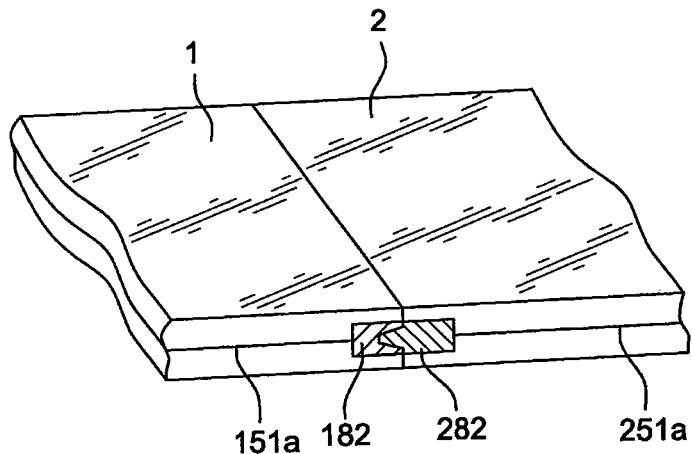

FIG. 4b shows a second embodiment of electrical connection means 18, in which said connection means are internal connectors 182 that are integrated between layers of structural part 1. The internal connectors 182 are accessible via the edge of said structural part, and are geometrically adapted to internal connectors 282 integrated in structural part 2, for example male/female connectors, such that said internal connectors 182 and 282 provide electrical continuity when structural parts 1 and 2 are assembled end-to-end.

Figure 4C:
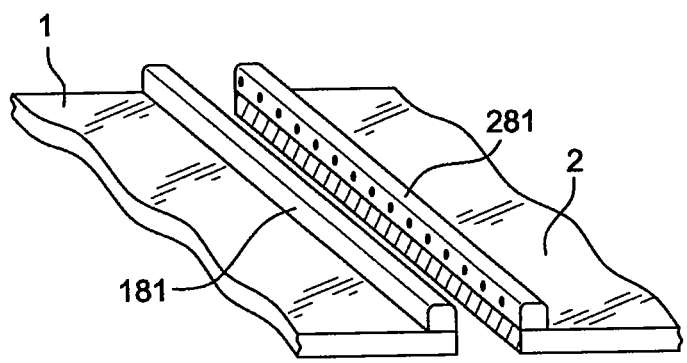

FIG. 4c shows a third embodiment of the electrical connection means 18, in which said connection means is an external connector 181, surface-mounted on the interconnection surface of the structural part 1, along a side of said part and of substantially the same length as said side. The external connector 181 is for example a flat multi-pin connector, each pin being linked to a conducting cable 151a-151c or the conductive reference layer 16. External connector 181 is geometrically adapted to an external connector 281 on the structural part 2, such as male/female sockets, to provide electrical continuity when the two structural parts 1 and 2 are assembled end-to-end.

Figure 4D:
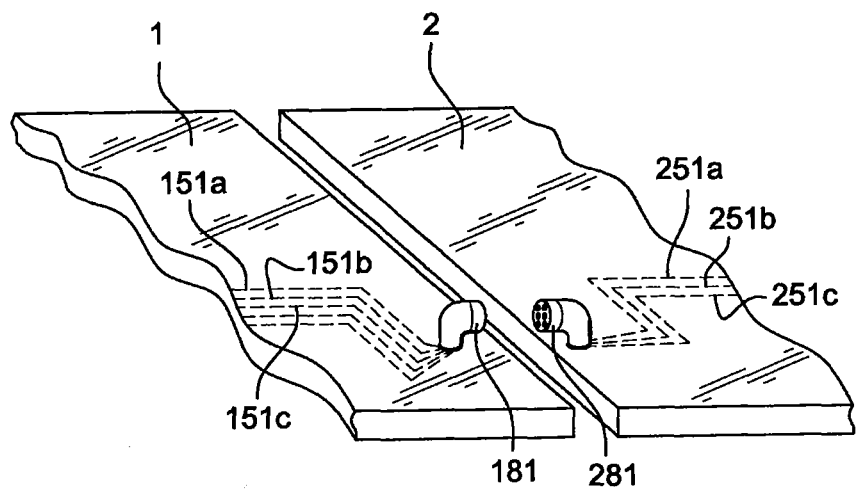

FIG. 4d shows a similar embodiment in which the external connector 181 has dimensions smaller than the length of the side of structural part 1, and conducting cables of network layer 15 meet at a convergence point, for example for using conventional external connectors.

The electrical connection means 18 are not limited to the means described, and all conventional connectors used for electrical/electronic connections, external or internal, can be used.

The electrical cables 151a-151c of the network layer 15, which all have a structural role in structural part 1, are not necessarily all connected to connection means 18, i.e. said conducting cables do not necessarily all have an electrical role of transmitting electrical signals. Connection means 18 are for example arranged with respect to the conducting cables that must be connected.

In another embodiment, all the conducting cables 151a-151c are connected to the electrical connection means 18, even if they are not all used for transmitting electrical signals.

Figure 5:
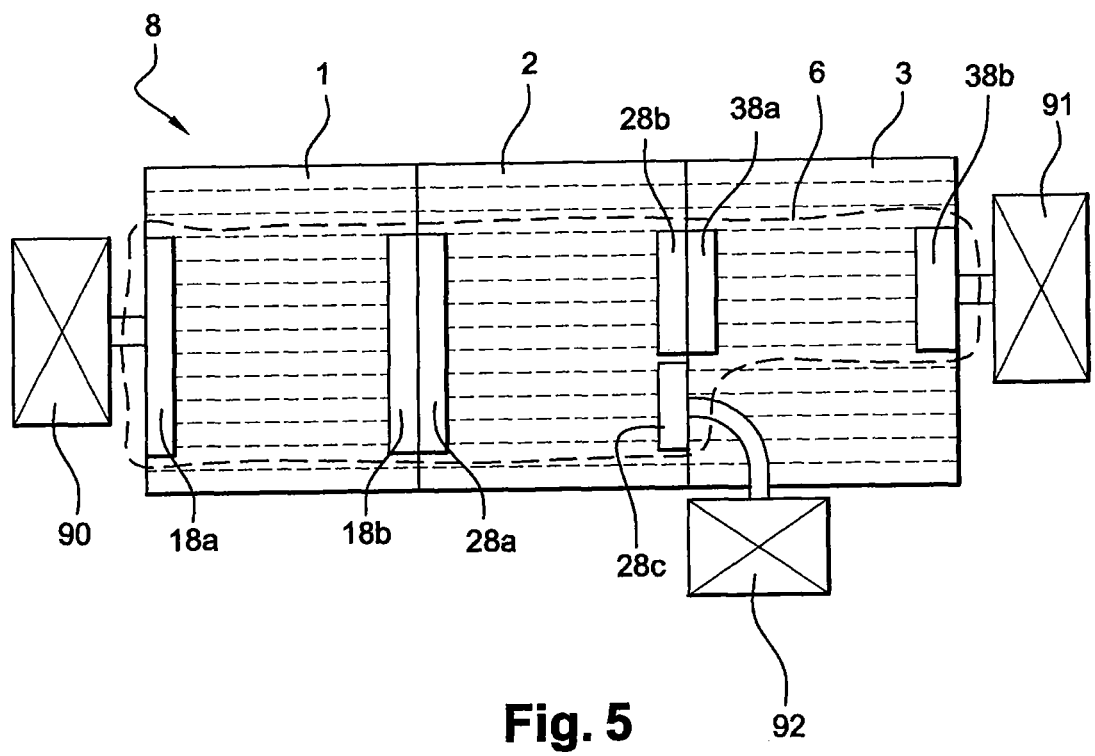

FIG. 5 shows an assembled load-bearing structure 8 comprising a plurality of rigid structural parts 1, 2 and 3 approximately rectangular in shape. An electrical network 6 is formed at the level of said load-bearing structure by connecting structural parts 1, 2 and 3 together via electrical connection means, 18a-18b, 28a-28c and 38a-38b respectively. Load-bearing structure 8 is, for instance, an aircraft-type vehicle floor that integrates the electrical network 6.

The electrical network 6 links electrical/electronic systems 90, 91 and 92, which are installed in different areas of the aircraft. In the example shown in FIG. 5, a first system 90 is linked to a second system 91 by structural parts 1, 2 and 3. The system 90 is also linked to a third system 92 by structural parts 1 and 2.

The system 90 is electrically connected to structural part 1 (i.e. to conducting cables 151a-151c of network layer 15 and conductive reference layer 16) via connection means 18a. In a similar way, systems 91 and 92 are electrically connected to parts 3 and 2 respectively via connection means 38b and 28c respectively.

Structural parts 2 and 3 are electrically interconnected via electrical connection means 28b and 38a.

The various conducting cables of structural parts 1, 2 and 3 are represented by dotted lines and, in the example shown in FIG. 5, some of the conducting cables have only a structural role, others have a role that is both structural and electrical and are connected to connection means.

In a preferred embodiment, the electrical network 6 is redundant, i.e. it comprises several links for transmitting an electrical signal from one electrical/electronic system to another, to ensure the transmission of said signal if a link fails. This invention therefore allows a structural part's mechanical resistance to be increased by integrating conducting cables oriented to take part in said mechanical resistance. The conducting cables are also used to transmit electrical signals, and structural parts according to this invention are assembled to produce a load-bearing structure at the level of which an electrical network is formed by connecting different part's cables via electrical connection means.

The invention claimed is:

1. A rigid structural floor panel of a load-bearing structure comprising; -a laminated composite material; and - a network of electrically conducting structural cables, integrated in the structural floor panel, the laminated composite material comprising: -at least two structural layers comprising electrically conductive fibers held in place by a matrix made of a thermosetting or thermoplastic resin, -at least one conducting network layer located between two of said at least two structural layers, said at least one conducting network layer comprising the electrically conducting structural cables, said electrically conducting structural cables being arranged throughout the structural floor panel in a substantially regular manner and being electrically insulated from said two structural layers by a dielectric material, -electrical connection means positioned to connect the structural floor panel to other structural parts, the electrically conducting structural cables of the at least one conducting network layer being electrically connected to the electrical connecting means, comprising at least three structural layers, and at least one conductive reference layer located between two of said at least three structural layers, said at least one conductive reference layer being conductive in all directions and being connected to the electrical connection means.

2. A rigid structural floor panel according to claim 1, comprising at least four structural layers and at least one layer of an alveolar-type material, located between two of said at least four structural layers.

3. A rigid structural floor panel according to claim 1, in which the at least one conductive reference layer is a metal sheet, or a grid comprised of metallic or metalized cables.

4. A rigid structural floor panel according to claim 1, wherein the at least one conductive reference layer is a layer of a metallic alveolar material.

5. A rigid structural floor panel according to claim 1, wherein the electrical connection means are metalized holes that open to an interconnection surface of said rigid structural floor panel.

6. A rigid structural floor panel according to claim 1, wherein the electrical connection means are external connectors surface-mounted on an interconnection surface of said rigid structural floor panel.

7. A rigid structural floor panel according to claim 1, wherein the electrical connection means are internal connectors located in said rigid structural floor panel and accessible from an interconnection surface or from an edge of said rigid structural floor panel.

8. A rigid structural floor panel according to claim 1, wherein the dielectric material is of the same composition as the thermosetting or thermoplastic resin of the structural layers.

9. A rigid structural floor panel according to claim 1, wherein the electrically conductive fibers comprise carbon fibers.

* * * * *

UNITED STATES PATENT AND TRADEMARK OFFICE
CERTIFICATE OF CORRECTION

PATENT NO. : 8,581,103 B2  Page 1 of 1
APPLICATION NO. : 12/746338
DATED : November 12, 2013
INVENTOR(S) : Jesus Aspas Puertolas It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 520 days.

Signed and Sealed this
Twenty-second Day of September, 2015

Michelle K. Lee
*Director of the United States Patent and Trademark Office*